US011296666B1

(12) United States Patent
Larsen et al.

(10) Patent No.: US 11,296,666 B1
(45) Date of Patent: Apr. 5, 2022

(54) HIGH COMMON MODE REJECTION RATIO (CMRR) CURRENT MONITORING CIRCUIT USING FLOATING SUPPLIES

(71) Applicant: Cirrus Logic International Semiconductor Ltd., Edinburgh (GB)

(72) Inventors: Christian Larsen, Austin, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 120 days.

(21) Appl. No.: 16/796,475

(22) Filed: Feb. 20, 2020

Related U.S. Application Data

(60) Provisional application No. 62/809,030, filed on Feb. 22, 2019.

(51) Int. Cl.
*H03F 3/45* (2006.01)
*G01R 19/00* (2006.01)
*G01R 1/20* (2006.01)
*H03F 3/393* (2006.01)
*H03F 1/26* (2006.01)

(52) U.S. Cl.
CPC ......... *H03F 3/45632* (2013.01); *G01R 1/203* (2013.01); *G01R 19/0092* (2013.01); *H03F 1/26* (2013.01); *H03F 3/393* (2013.01); *H03F 3/45179* (2013.01)

(58) Field of Classification Search
CPC .... H03F 3/45632; H03F 3/45179; H03F 1/26; H03F 3/393; H03F 3/45183; H03F 3/45192; H03F 3/217; H03F 3/2173; H03F 3/2171; H03F 2200/351; G01R 19/0092; G01R 1/203

USPC ...................................... 330/207 A, 251, 253
See application file for complete search history.

(56) References Cited

U.S. PATENT DOCUMENTS

| | | | | |
|---|---|---|---|---|
| 9,264,002 | B2* | 2/2016 | Ni | H03F 3/45991 |
| 9,960,741 | B2* | 5/2018 | Mengad | G01R 27/08 |
| 9,983,233 | B2* | 5/2018 | Kaya | G01R 19/0092 |
| 10,132,844 | B2 | 11/2018 | Parupalli et al. | |
| 10,206,037 | B2* | 2/2019 | Chawla | H04R 3/007 |
| 10,312,865 | B2* | 6/2019 | Wan | H03F 1/0233 |
| 10,320,346 | B2* | 6/2019 | Puscasu | H03F 3/4521 |

* cited by examiner

*Primary Examiner* — Khanh V Nguyen
(74) *Attorney, Agent, or Firm* — E. Alan Davis; James W. Huffman (57) ABSTRACT

A high CMRR current monitoring circuit includes a first stage that receives a current sense signal, a voltage across a current sense resistor in series with an output of a class-D amplifier. First stage is powered by at least one floating supply and/or reference that tracks the amplifier output. First stage applies gain to the current sense signal to generate an intermediate signal. A second stage receives the intermediate signal and is powered by a ground-referenced supply and provides an amplified representation of the current sense signal. The floating supply is supplied by a capacitive-coupled power source driven by the ground-referenced supply. The second stage output may be a voltage relative to ground or a digital signal. The intermediate signal may be a current, digital signal, or amplified version of the current sense signal voltage. The first stage may be a transconductance amplifier and the second stage a transimpedance amplifier.

20 Claims, 10 Drawing Sheets

HIGH COMMON MODE REJECTION RATIO (CMRR) CURRENT MONITORING CIRCUIT USING FLOATING SUPPLIES

CROSS REFERENCE TO RELATED APPLICATION(S)

This application claims priority based on U.S. Provisional Application, Ser. No. 62/809,030, filed Feb. 22, 2019, which is hereby incorporated by reference in its entirety.

BACKGROUND

Many amplifiers today include a current monitoring (IMON) circuit to accurately sense the current to the load. Generally speaking, current is most accurately and directly measured using a small (e.g., 100 milli-Ohm) series sense resistor. Voltage across the resistor is amplified and sent to an analog-to-digital converter (ADC). Applications and algorithms that use a load current measured in this manner have driven the common-mode rejection requirement for the current monitor analog front end (AFE) to be extremely demanding. Many amplifiers use pulse width modulation (PWM) voltage switching on the output. The PWM switching results in a high common-mode voltage swing. The baseband common-mode voltage swing can be similarly high due to duty-cycle modulation in the PWM signal. The measured current should have high rejection, e.g., 60 dB or higher, to the voltage swing. Since the common-mode voltage swing may be around 40 dB higher than the differential input voltage, this results in a 100 dB common mode rejection ratio (CMRR) design challenge.

A switched-capacitor (SC) AFE to sample voltage across a sense resistor could be used since SC networks have inherently high CMRR. However, the direct sampling nature of such an AFE on a signal that is PWM modulated and contains class-D noise shaping limits the achievable total harmonic distortion (THD) and dynamic range. An anti-aliasing filter (AAF) before sampling is desired.

Figure 1:
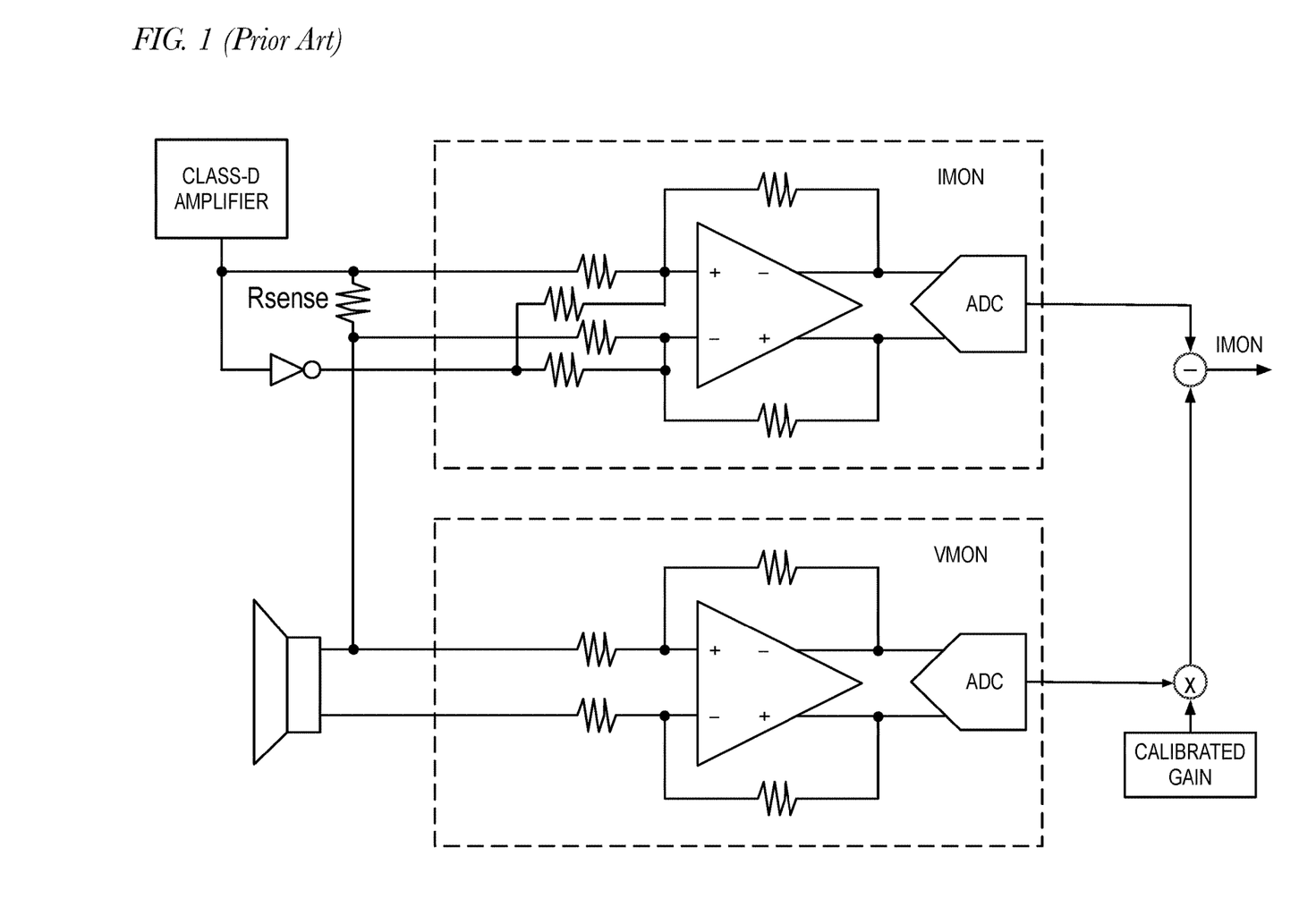
FIG. 1 is a prior art system that leverages the presence of a voltage monitor (VMON) analog-to-digital converter to digitally remove common-mode voltage converted by a current monitor analog-to-digital converter due to device mismatch.

An approach illustrated in FIG. 1 and described in U.S. Pat. No. 10,132,844 leverages the presence of a voltage monitor (VMON) ADC to digitally remove the common-mode voltage that was converted by the IMON ADC due to device mismatch. A calibration routine is used to measure the common-mode leakage and to calculate the compensation factor needed in digital cancelation. This architecture requires that the components that determine CMRR be constant. However, practical realizations have shown that temperature, aging, mechanical stress (e.g., solder-related), for example, can result in resistor matching shifting by several 10's of ppm, enough to degrade the CMRR to be below specification.

SUMMARY

In one embodiment, the present disclosure provides a high CMRR current monitoring circuit that includes a first stage that receives a current sense signal that is a voltage across a current sense resistor that is in series with an output of a class-D amplifier. The first stage is powered by at least one floating supply and/or reference that tracks the amplifier output. The first stage applies gain to the current sense signal to generate an intermediate signal. The current monitoring circuit also includes a second stage that receives the intermediate signal from the first stage and provides an output that is an amplified representation of the current sense signal. The second stage is powered by a ground-referenced supply.

In another embodiment, the present disclosure provides a method for monitoring a current with high CMRR that includes receiving, by a first stage, a current sense signal that is a voltage across a current sense resistor that is in series with an output of a class-D amplifier. The first stage is powered by at least one floating supply and/or reference that tracks the amplifier output. The method also includes applying, by the first stage, gain to the current sense signal to generate an intermediate signal. The method also includes receiving, by a second stage, the intermediate signal from the first stage and providing an output that is an amplified representation of the current sense signal. The second stage is powered by a ground-referenced supply.

DETAILED DESCRIPTION

Figure 2:
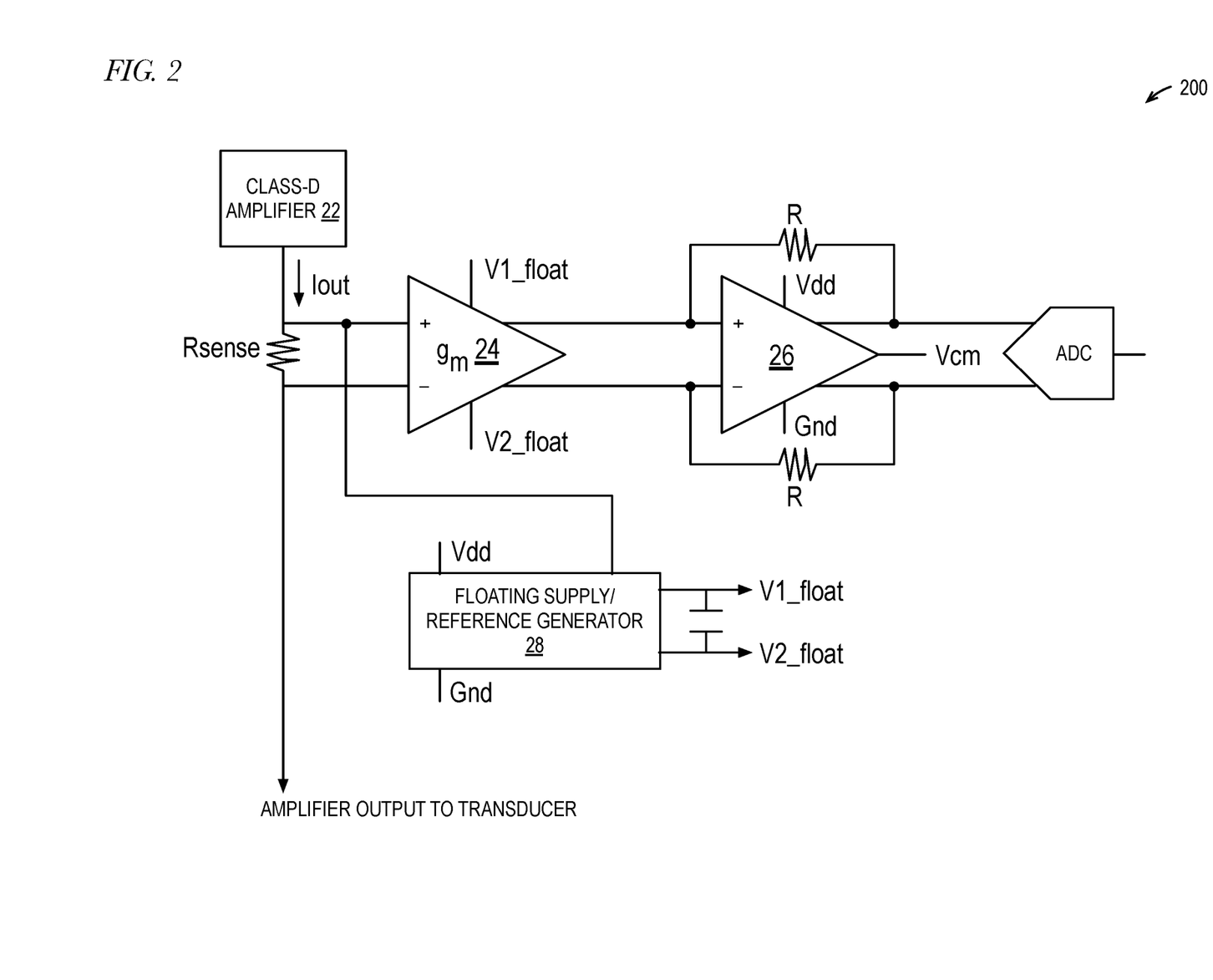
FIG. 2 is an example of a high CMRR current monitoring circuit that uses floating supplies in accordance with embodiments of the present disclosure.

FIG. 2 is an example of a high common mode rejection ratio (CMRR) current monitoring circuit 200 that uses floating supplies in accordance with embodiments of the present disclosure. The current monitoring circuit 200, which includes a first stage 24 with floating supplies and/or references V1_float and V2_float, is used to address the CMRR requirements. The first stage 24 is also referred to as an analog front end (AFE) or pre-amplifier. In the embodiment of FIG. 2, the first stage 24 uses a transconductance ($g_m$) amplifier. The input CMRR of the transconductance amplifier $g_m$ 24 is very high by using the floating supplies and/or references V1_float and V2_float that track the common-mode of the input signal which is, for example, a voltage across a current sense resistor Rsense in series with a class-D amplifier 22 output that provides an output current Iout to a transducer, or load, e.g., speaker, camera motor, etc.

The first stage 24 effectively sees zero common-mode swing at its input relative to its input supplies and/or references V1_float and V2_float, which allows the area and power consumed by the amplifier to be focused on low-noise and high-linearity differential gain. The output CMRR of the first stage 24 may be very high due to having a very high output impedance through the use of, for example, cascodes, gain boosting, etc., which effectively eliminates sensitivity to device mismatch that can lead to baseband conversion of input common-mode to output differential. The first stage 24 generates an intermediate signal received by a second stage 26 that uses a constant power/ground pair of supplies Vdd/Gnd to generate an output that is an amplified representation of the signal across the current sense resistor Rsense.

A generator 28 of the floating supplies and/or references V1_float and V2_float is capacitively-coupled to the constant power/ground supplies Vdd/Gnd used by the second stage 26. The floating supply/reference generator 28 directly tracks the voltage at either of the terminals of the sense resistor Rsense, i.e., the first stage 24 input common-mode voltage. That is, although FIG. 2 illustrates the floating supply/reference generator 28 tracking the voltage at the upper terminal of the sense resistor Rsense, in other embodiments the voltage at the other terminal is tracked. Examples of floating supply/reference generators are shown in FIGS. 3 and 4, although other embodiments are contemplated, and the design of floating supply/reference generators is well known.

In the embodiment of FIG. 2, the intermediate signal is a differential current output of the first stage 24 (e.g., transconductance amplifier $g_m$) that is fed into a transimpedance amplifier of the second stage 26 that uses constant ground-referred input and output common-mode voltages Vcm. In the embodiment of FIG. 2, the output of the second stage 26 is a voltage relative to ground that is converted to a digital signal by an analog-to-digital converter (ADC).

Figure 3:
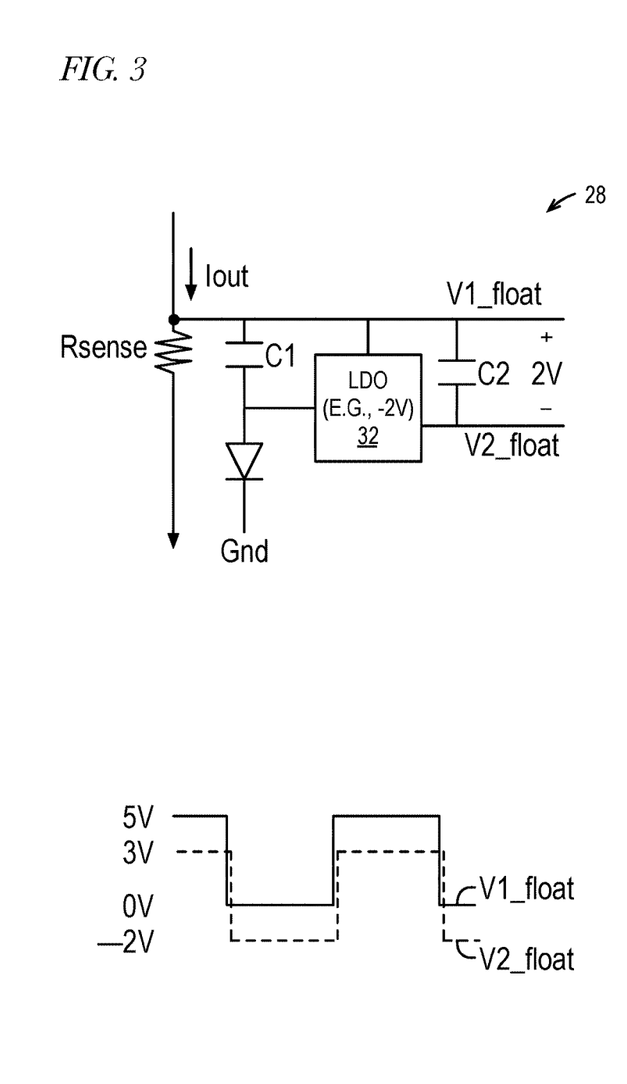
FIG. 3 is an example of a floating supply/reference generator in accordance with embodiments of the present disclosure.

FIG. 3 is an example of a floating supply/reference generator, e.g., floating supply/reference generator 28 of FIG. 2, in accordance with embodiments of the present disclosure. In the embodiment of FIG. 3, the floating supply/reference generator 28 includes a first capacitor C1 having a first terminal connected to a terminal of the sense resistor Rsense of FIG. 2 and a second terminal connected to a ground-connected diode. However, the floating supply/reference generator 28 may be referenced to either side of the current sense resistor Rsense or to the middle of the resistor Rsense. Because the voltage across the sense resistor Rsense is nominally small with respect to the supply voltage, the manner of the reference connections may be a design optimization. The floating supply/reference generator 28 may be positive or negative with respect to the reference terminal, again as a design optimization. Embodiments are contemplated in which multiple supplies may be used, e.g. a positive and a negative supply with respect to the reference terminal. In the embodiment of FIG. 3, the voltage at the sense resistor Rsense terminal is V1_float. A low dropout (LDO) regulator 32 receives the voltage at the sense resistor Rsense terminal as a reference and receives the voltage at the second terminal of the first capacitor C1. The LDO regulator 32 outputs V2_float. A second capacitor C2 is connected between V1_float and V2_float. The embodiment of FIG. 3 may be referred to as a bootstrap topology. When the class-D amplifier drives the sense resistor Rsense high, and hence drives the reference V1_float high, the input capacitor C1 is charged via the diode. When the class-D amplifier output is low, the capacitor C1 supplies the operating current for the amplifier. Because the class-D amplifier switches at a high frequency, e.g., 1 MHz, the capacitor C1 is regularly recharged. The LDO 32 may be added to improve the noise and ripple characteristics of the floating supply/reference generator 28. In the example of FIG. 3, the LDO regulator 32 is a −2 Volt regulator such that the difference between V1_float and V2_float is kept at a constant value of 2 Volts. FIG. 3 also shows an example signal diagram that illustrates V1_float and V2_float assuming a swing of the PWM signal out of the class-D amplifier from 5 Volts to 0 Volts, although other values may be employed. As may be observed from the signal diagram of FIG. 3, the floating supplies and/or references V1_float and V2_float track the output of the class-D amplifier. In other embodiments, the floating supply/reference generator 28 may generate the floating supplies and/or references V1_float and V2_float that are positive with respect to the reference, negative with respect to the reference, or split with respect to the reference.

Figure 4:
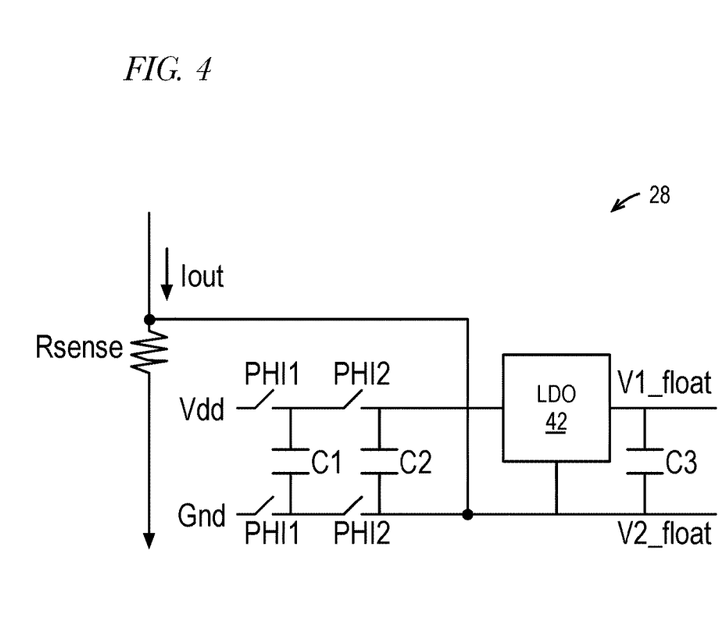
FIG. 4 is an example of a floating supply/reference generator in accordance with embodiments of the present disclosure.

FIG. 4 is an example of a floating supply/reference generator, e.g., floating supply/reference generator 28 of FIG. 1, in accordance with embodiments of the present disclosure. The floating supply/reference generator 28 includes an LDO regulator 42 that receives the voltage at the sense resistor Rsense terminal, V2_float, as a reference and outputs V1_float. The embodiment of FIG. 4 employs a switched capacitor (SC) circuit that operates according to clocks, denoted phi1 and phi2 in FIG. 4, that are inverted versions of one another and that control switches as shown. A first capacitor C1 is connected across Vdd and Gnd through a first pair of switches when phi1 is active. A second capacitor C2 is connected across the first capacitor C1 through a second pair of switches when phi2 is active. The Vdd-side terminal of the second capacitor C2 is connected to the LDO regulator 42, and the Gnd-side terminal of the second capacitor C2 provides V2_float. A third capacitor C3 is connected across V1_float and V2_float. The switched capacitor topology of FIG. 4 allows for smaller capacitors switched at higher frequencies relative to the embodiment of FIG. 3. For example, the phi1/phi2 switches may switch at 20 MHz. During phase one, switched capacitor C1 is charged to Vdd, and during phase 2 capacitor C1 transfers the charge to the floating supply. The LDO 42 may reduce noise and ripple of the floating supply/reference generator 28. The topology of FIG. 4 may be varied for a positive, negative, or bipolar floating supply with respect to the reference terminal.

Figure 5:
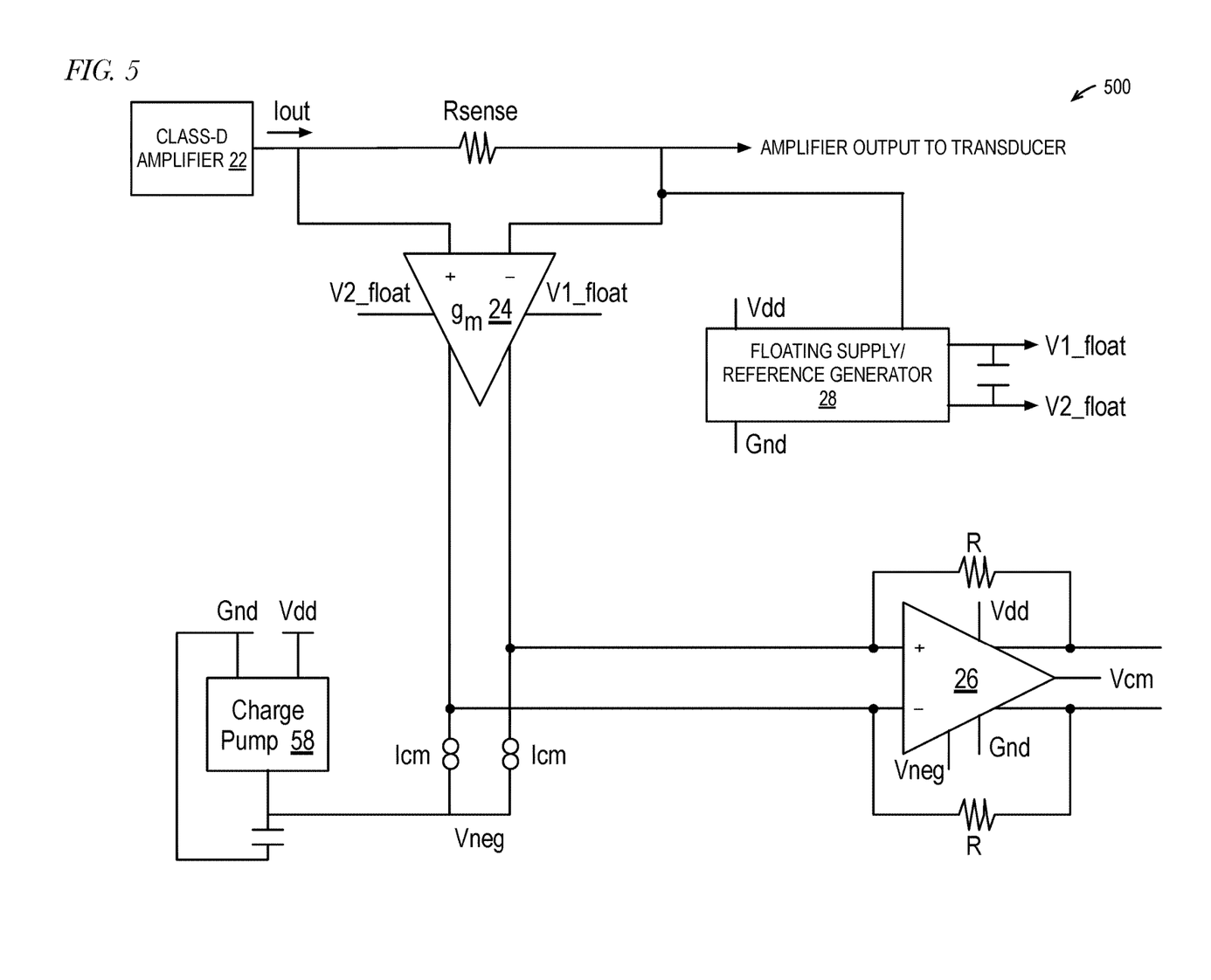
FIGS. 5 through 7 are examples of a high CMRR current monitoring circuit that uses floating supplies in accordance with embodiments of the present disclosure.

FIG. 5 is an example of a high CMRR current monitoring circuit 500 that uses floating supplies in accordance with embodiments of the present disclosure. The current monitoring circuit 500 of FIG. 5 is similar in many respects to the current monitoring circuit 200 of FIG. 2. However, the current monitoring circuit 500 embodiment of FIG. 5 includes an additional supply rail above or below the range of the input common-mode. In the class-D application, the output of the class-D amplifier 22 commonly swings from zero (0) up to the supply of the class-D stage 22, and in some embodiments slightly beyond, due to overshoot during switching. For the transconductance amplifier gm 24 to remain in operation, its input common-mode is maintained in the range supported by its floating supplies and/or references V1_float and V2_float. In the embodiment of FIG. 5, a charge pump 58 that uses a constant power/ground pair of supplies Vdd/Gnd is used to generate the additional supply Vneg to enable the floating supplies and/or references V1_float and V2_float to go below 0V or above the class-D amplifier 22 supply voltage. For example, Vneg may be −2 Volts with respect to Gnd. Constant current sources Icm from the charge-pump generated rail Vneg may then be added to control the common-mode voltage at the input of the transimpedance amplifier of the second stage 26.

Figure 6:
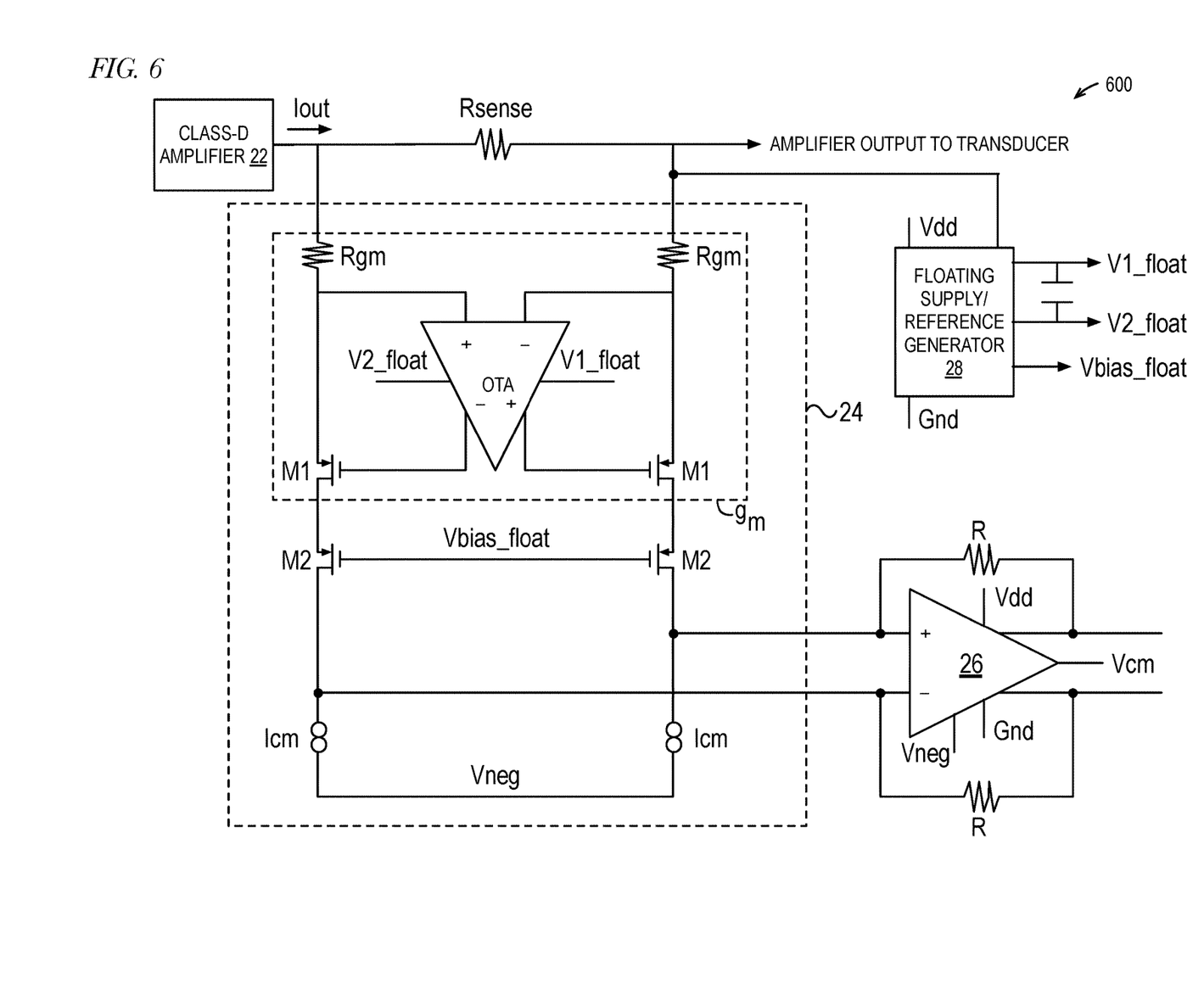

FIG. 6 is an example of a high CMRR current monitoring circuit 600 that uses floating supplies in accordance with embodiments of the present disclosure. The current monitoring circuit 600 of FIG. 6 is similar in many respects to the current monitoring circuit 500 of FIG. 5. In the embodiment of FIG. 6, the first stage 24 comprises a transconductance amplifier $g_m$ that includes an operational transconductance amplifier (OTA) whose inputs are coupled to respective terminals of the sense resistor Rsense by respective resistors Rgm and to whose outputs a pair of Field-Effect-Transistors (FETs) M1 are connected and which are used to linearly measure the voltage across the sense resistor Rsense and generate a differential output current. A differential amplifier may be used to further linearize the voltage measurement. The OTA is supplied by the floating supply and ground rails V1_float and V2_float. The input common-mode may be set by sensing the common-mode of the sense resistor Rsense or by using one of the sense resistor Rsense terminals. In one embodiment, to improve the performance (e.g., increase the output impedance) of the first stage 24, respective cascodes M2 may be added, e.g., connected to the respective FETs M1. The cascodes M2 may be biased via a Vbias float reference that tracks the input common-mode and that is generated by the floating supply/reference generator 28.

Figure 7:
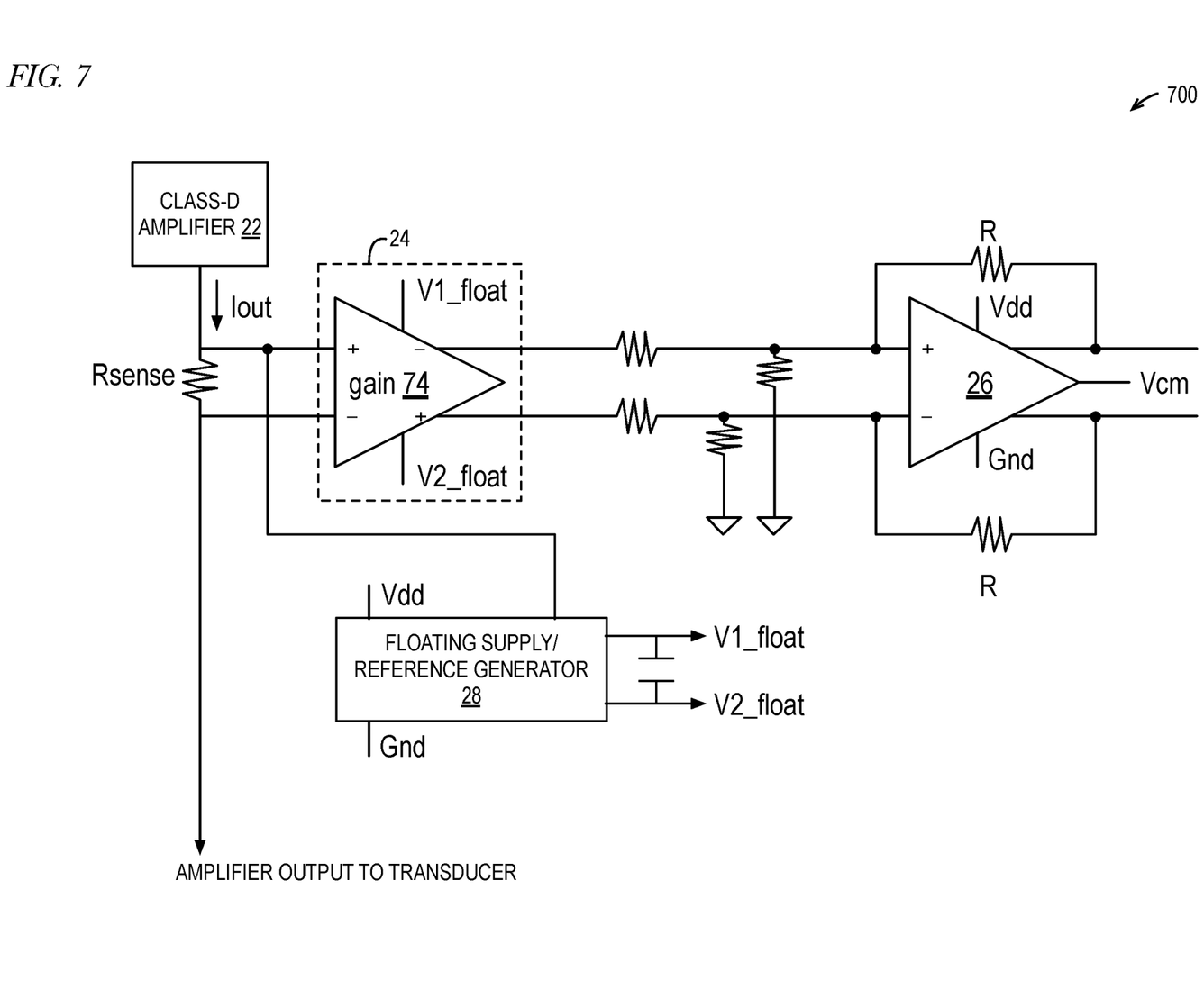

FIG. 7 is an example of a high CMRR current monitoring circuit 700 that uses floating supplies in accordance with embodiments of the present disclosure. The current monitoring circuit 700 of FIG. 7 is similar in many respects to the current monitoring circuit 200 of FIG. 2. However, in the current monitoring circuit 700 embodiment of FIG. 7, the first stage 24 is a voltage gain amplifier 74 that applies gain to the current sense resistor Rsense voltage to produce the intermediate signal that is a voltage.

Figure 8A:
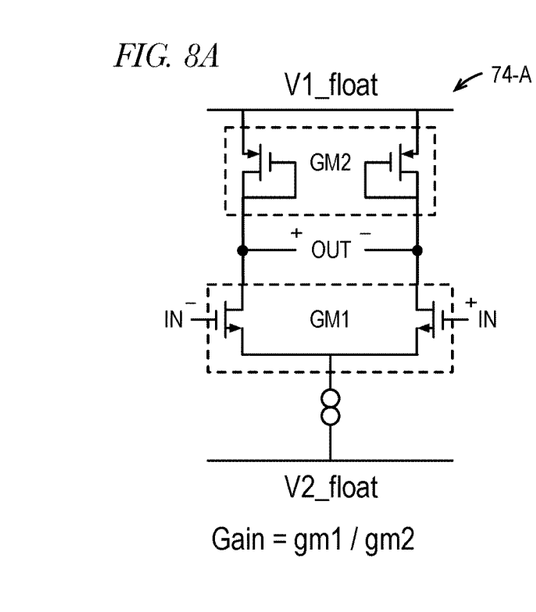
FIGS. 8A-8C are examples of different open-loop embodiments of the first stage voltage gain of FIG. 7 in accordance with embodiments of the present disclosure.
Figure 8B:
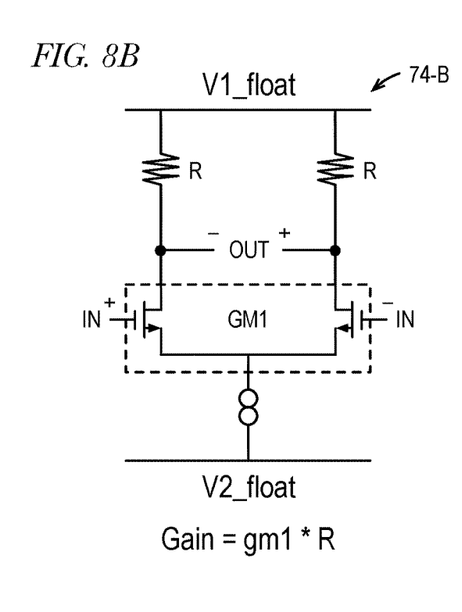
Figure 8C:
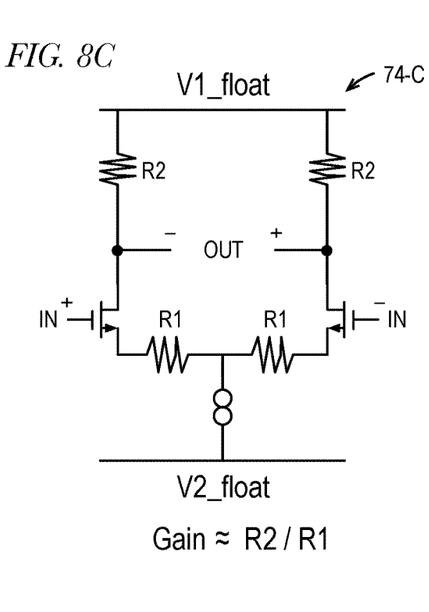
Figure 8D:
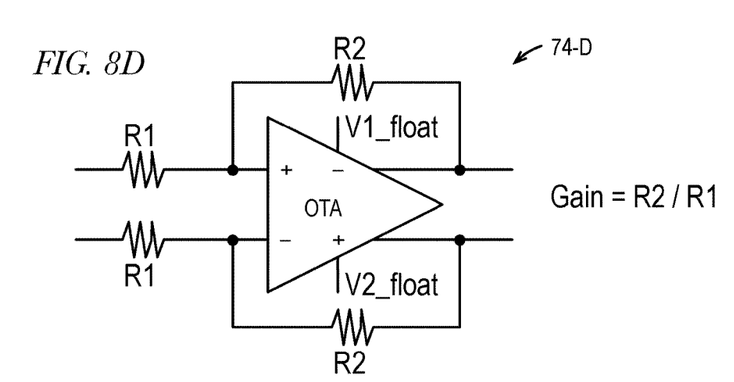
FIG. 8D is an example of a closed-loop embodiment of the first stage voltage gain of FIG. 7.

FIGS. 8A through 8C illustrate examples of different open-loop embodiments of the voltage gain amplifier 74 of FIG. 7 in accordance with embodiments of the present disclosure. As shown in FIG. 8A, the gain of the voltage gain amplifier 74-A is the ratio of the transconductance gm1/gm2 of a pair of respective transconductors GM1 and GM2. As shown in FIG. 8B, the gain of the voltage gain amplifier 74-B is the product of the transconductance gm1 of a transconductor GM1 and the resistance of a resistor R. As shown in FIG. 8C, the gain of the voltage gain amplifier 74-C is the ratio of the resistance R2/R1 of a pair resistors R2 and R1. FIG. 8D illustrates an example of a closed-loop embodiment of the voltage gain amplifier 74 of FIG. 7 that includes an OTA and in which the gain of the voltage gain amplifier 74-D is the ratio of the resistance R2/R1 of a pair of respective feedback and input resistors R2 and R1.

Figure 9:
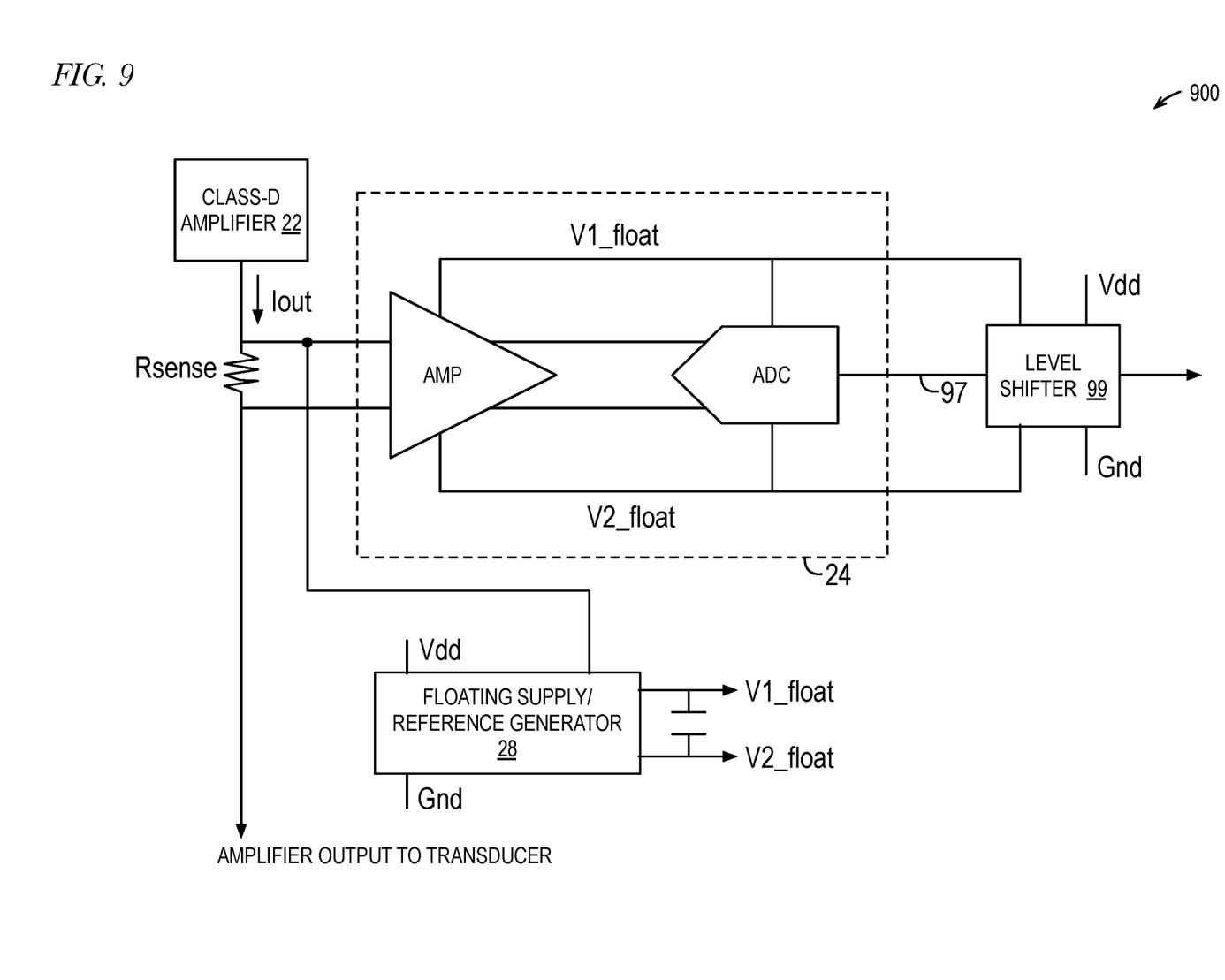
FIG. 9 is an example of a high CMRR current monitoring circuit that uses floating supplies in accordance with embodiments of the present disclosure.

FIG. 9 is an example of a high CMRR current monitoring circuit 900 that uses floating supplies in accordance with embodiments of the present disclosure. The current monitoring circuit 900 of FIG. 9 is similar in many respects to the current monitoring circuit 200 of FIG. 2. However, in the current monitoring circuit 900 embodiment of FIG. 9, the intermediate signal 97 is a digital signal. The first stage 24 includes an amplifier AMP whose output is converted to a digital signal 97 by an ADC, whose output is provided to a level-shifter 99. Both the amplifier AMP and ADC are powered by the floating supplies and/or references V1_float and V2_float. In one embodiment, the amplifier AMP outputs an amplified voltage (e.g., per FIG. 7) and the ADC converts an analog voltage to a digital voltage. In another embodiment, the amplifier AMP outputs a current (e.g., per FIG. 2) and the ADC converts an analog current to a digital current. The level shifter 99 uses both the floating supplies and/or references V1_float and V2_float and the constant power/ground supplies Vdd/Gnd to generate an output that is an amplified representation of the signal across the current sense resistor Rsense.

Figure 10:
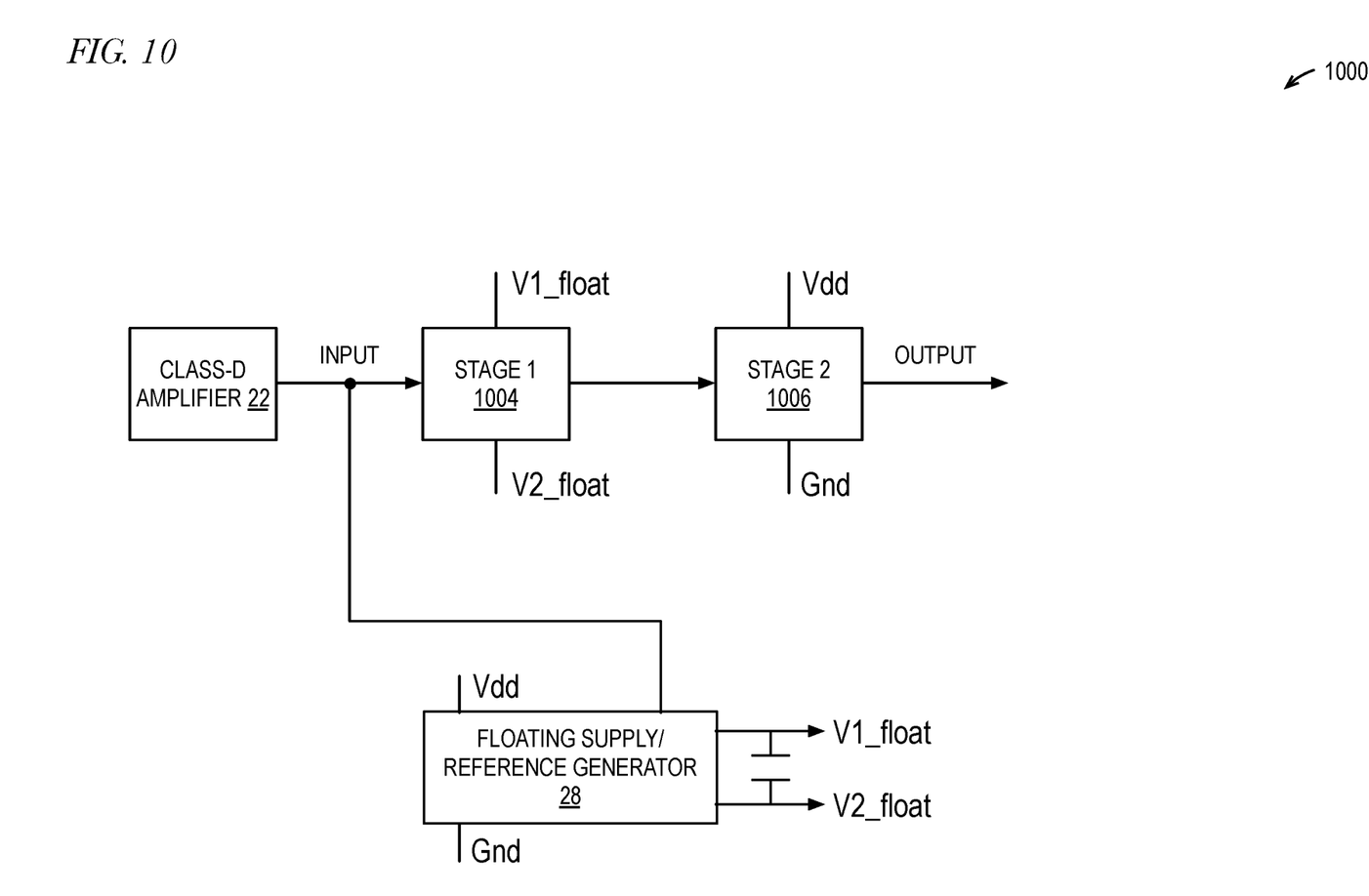
FIG. 10 is a generalization of embodiments of a high CMRR current monitoring circuit (e.g., of FIGS. 4 through 9) that uses floating supplies in accordance with embodiments of the present disclosure.

FIG. 10 is a generalization of embodiments of a high CMRR current monitoring circuit 1000 (e.g., of FIGS. 2 through 9) that uses floating supplies in accordance with embodiments of the present disclosure. Generally, the current monitoring circuit 1000 includes a signal path having two or more stages, shown as stage 1 1004 and stage 2 1006 in FIG. 10. The first stage 1004 is supplied by floating supplies and/or references V1_float and V2_float that track the input signal from the class-D amplifier 22. The first stage 1004 pre-processes the input signal to reduce its sensitivity to common-mode, such as by applying signal gain, converting to current, or converting to digital. The processed signal is sent from the floating domain in the first stage 1004 to a following stage 1006 that uses supplies on the desired destination domain. The input signal may be voltage or current, single ended or differential. The signal path may be entirely analog or may be mixed analog/digital. A floating reference may comprise, for example, a passive cascode voltage that tracks the class-D amplifier 22 output. In some embodiments, a passive cascode may be sufficient to provide a transconductance amplifier gm of the first 24 stage sufficient output impedance if the passive cascode tracks a reference voltage. In such an embodiment, a high-impedance reference signal is employed as opposed to a low impedance power or ground.

Figure 11:
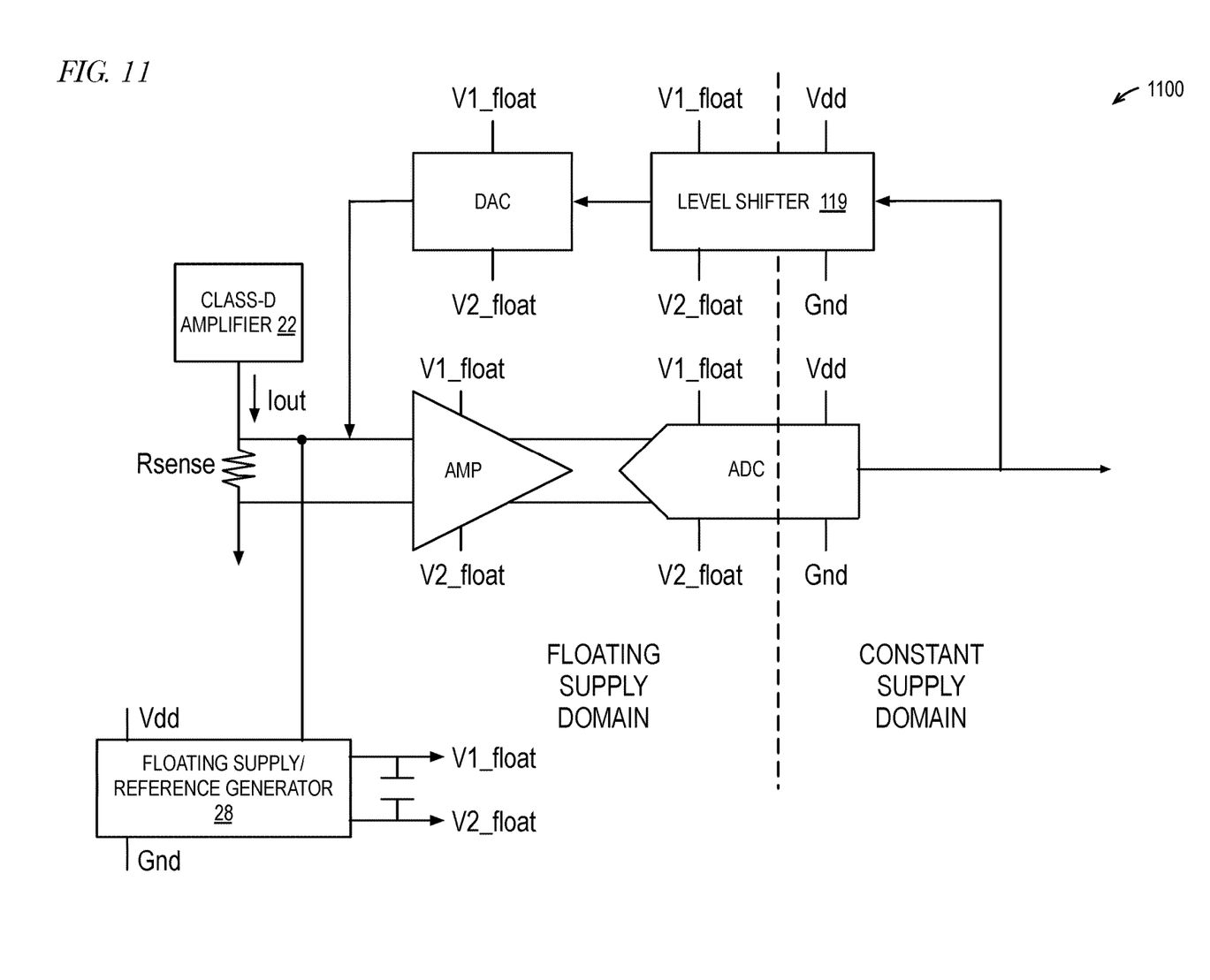
FIG. 11 is an example of a high CMRR current monitoring circuit that uses floating supplies in accordance with embodiments of the present disclosure.

FIG. 11 is an example of a high CMRR current monitoring circuit 1100 that uses floating supplies in accordance with embodiments of the present disclosure. The current monitoring circuit 1100 of FIG. 11 is similar in many respects to the current monitoring circuit 900 of FIG. 9. FIG. 11 is intended to illustrate that various embodiments are contemplated in which the divide in a high CMRR current monitoring circuit between the floating supply domain and the constant supply domain may occur at different places than described with respect to FIGS. 2 through 10. In the current monitoring circuit 1100 embodiment of FIG. 11, an amplifier AMP that operates in the floating supply domain (i.e., uses the floating supplies and/or references V1_float and V2_float) receives the input voltage (i.e., voltage across Rsense) and provides the intermediate signal to an ADC that generates the digital output. The ADC operates in both the floating supply domain and the constant supply domain (i.e., uses the constant power/ground supplies Vdd/Gnd). For example, the ADC may include a transconductance amplifier or integrator that uses the floating supplies and/or references V1_float and V2_float and may include a delta-sigma converter, integrator or quantizer that uses the constant power/ground supplies Vdd/Gnd. The digital output is fed back to a level shifter 119 whose front end operates in the floating supply domain and whose back end operates in the constant supply domain and provides level-shifted feedback to a DAC that operates in the floating supply domain to provide the analog feedback to the amplifier AMP.

An advantage of the described embodiments is high CMRR provided directly by the current monitoring circuit, which alleviates the need for additional calibration or digital compensation. Another advantage is the embodiments may significantly reduce sensitivity to shifts in process parameters such as matching. Another advantage is the embodiments may allow for flexibility in integrated circuit (chip) floorplanning due to reduced sensitivity to temperature, aging, mechanical stress near wafer level chip scale package (WLCSP) bump edges, for example. Another advantage is the embodiments may occupy potentially lower or comparable area and consume lower or comparable power to conventional current monitoring circuits. Another advantage is the embodiments do not require additional circuitry for local common-mode cancelation.

It should be understood—especially by those having ordinary skill in the art with the benefit of this disclosure—that the various operations described herein, particularly in connection with the figures, may be implemented by other circuitry or other hardware components. The order in which each operation of a given method is performed may be changed, unless otherwise indicated, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Similarly, although this disclosure refers to specific embodiments, certain modifications and changes can be made to those embodiments without departing from the scope and coverage of this disclosure. Moreover, any benefits, advantages, or solutions to problems that are described herein with regard to specific embodiments are not intended to be construed as a critical, required, or essential feature or element.

Further embodiments, likewise, with the benefit of this disclosure, will be apparent to those having ordinary skill in the art, and such embodiments should be deemed as being encompassed herein. All examples and conditional language recited herein are intended for pedagogical objects to aid the reader in understanding the disclosure and the concepts contributed by the inventor to furthering the art and are construed as being without limitation to such specifically recited examples and conditions.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

Finally, software can cause or configure the function, fabrication and/or description of the apparatus and methods described herein. This can be accomplished using general programming languages (e.g., C, C++), hardware description languages (HDL) including Verilog HDL, VHDL, and so on, or other available programs. Such software can be disposed in any known non-transitory computer-readable medium, such as magnetic tape, semiconductor, magnetic disk, or optical disc (e.g., CD-ROM, DVD-ROM, etc.), a network, wire line or another communications medium, having instructions stored thereon that are capable of causing or configuring the apparatus and methods described herein.

The invention claimed is:

1. A high common mode rejection ratio (CMRR) current monitoring circuit, comprising:
    a first stage that receives a current sense signal that is a voltage across a current sense resistor that is in series with an output of a class-D amplifier;
    wherein the first stage is powered by at least one floating supply and/or reference that tracks the class-D amplifier output;
    wherein the first stage applies gain to the current sense signal to generate an intermediate signal;
    a second stage that receives the intermediate signal from the first stage and provides an output that is an amplified representation of the current sense signal, wherein the second stage is powered by a ground-referenced supply; and
    wherein the at least one floating supply and/or reference is supplied by a capacitive-coupled power source driven by the ground-referenced supply.

2. The high CMRR current monitoring circuit of claim 1, wherein the second stage output is a voltage relative to ground or is a digital signal.

3. The high CMRR current monitoring circuit of claim 1, wherein the intermediate signal is a voltage that is an amplified version of the current sense signal voltage.

4. The high CMRR current monitoring circuit of claim 1, wherein the intermediate signal is a digital signal.

5. The high CMRR current monitoring circuit of claim 1, wherein the intermediate signal is a current.

6. The high CMRR current monitoring circuit of claim 5, wherein the first stage comprises a transconductance amplifier that is powered by the at least one floating supply and/or reference and generates the intermediate signal current.

7. The high CMRR current monitoring circuit of claim 6, wherein the second stage comprises a transimpedance amplifier that is powered by the ground-referenced supply; and
    wherein the transimpedance amplifier includes an input that receives the intermediate signal current from the transconductance amplifier.

8. The high CMRR current monitoring circuit of claim 7, further comprising:
    an additional supply rail that enables the floating supply and/or reference to go below or above a supply voltage of the class-D amplifier.

9. The high CMRR current monitoring circuit of claim 1, wherein the at least one floating supply and/or reference tracks the amplifier output by providing a voltage to the first stage that is approximately constant with respect to a terminal of the current sense resistor.

10. A method for monitoring a current with high common mode rejection ratio (CMRR), comprising:
    receiving, by a first stage, a current sense signal that is a voltage across a current sense resistor that is in series with an output of a class-D amplifier;
    wherein the first stage is powered by at least one floating supply and/or reference that tracks the class-D amplifier output;
    applying, by the first stage, gain to the current sense signal to generate an intermediate signal;
    receiving, by a second stage, the intermediate signal from the first stage and providing an output that is an amplified representation of the current sense signal, wherein the second stage is powered by a ground-referenced supply; and wherein the at least one floating supply and/or reference is supplied by a capacitive-coupled power source driven by the ground-referenced supply.

11. The method of claim 10,
wherein the second stage output is a voltage relative to ground or is a digital signal.

12. The method of claim 10,
wherein the intermediate signal is a voltage that is an amplified version of the current sense signal voltage.

13. The method of claim 10,
wherein the intermediate signal is a digital signal.

14. The method of claim 10,
wherein the intermediate signal is a current.

15. The method of claim 14,
wherein the first stage comprises a transconductance amplifier that is powered by the at least one floating supply and/or reference and generates the intermediate signal current.

16. The method of claim 15,
wherein the second stage comprises a transimpedance amplifier that is powered by the ground-referenced supply; and
wherein the transimpedance amplifier includes an input that receives the intermediate signal current from the transconductance amplifier.

17. The method of claim 16, further comprising:
providing an additional supply rail that enables the floating supply and/or reference to go below or above a supply voltage of the class-D amplifier.

18. The method of claim 10,
wherein the at least one floating supply and/or reference tracks the amplifier output by providing a voltage to the first stage that is approximately constant with respect to a terminal of the current sense resistor.

19. A high common mode rejection ratio (CMRR) current monitoring circuit, comprising:
a first stage that receives a current sense signal that is a voltage across a current sense resistor that is in series with an output of a class-D amplifier;
wherein the first stage is powered by at least one floating supply and/or reference that tracks the class-D amplifier output;
wherein the first stage applies gain to the current sense signal to generate an intermediate signal;
a second stage that receives the intermediate signal from the first stage and provides an output that is an amplified representation of the current sense signal, wherein the second stage is powered by a ground-referenced supply;
wherein the intermediate signal is a current;
wherein the first stage comprises a transconductance amplifier that is powered by the at least one floating supply and/or reference and generates the intermediate signal current;
wherein the second stage comprises a transimpedance amplifier that is powered by the ground-referenced supply;
wherein the transimpedance amplifier includes an input that receives the intermediate signal current from the transconductance amplifier; and
an additional supply rail that enables the floating supply and/or reference to go below or above a supply voltage of the class-D amplifier.

20. A method for monitoring a current with high common mode rejection ratio (CMRR), comprising:
receiving, by a first stage, a current sense signal that is a voltage across a current sense resistor that is in series with an output of a class-D amplifier;
wherein the first stage is powered by at least one floating supply and/or reference that tracks the class-D amplifier output;
applying, by the first stage, gain to the current sense signal to generate an intermediate signal;
receiving, by a second stage, the intermediate signal from the first stage and providing an output that is an amplified representation of the current sense signal, wherein the second stage is powered by a ground-referenced supply;
wherein the intermediate signal is a current;
wherein the first stage comprises a transconductance amplifier that is powered by the at least one floating supply and/or reference and generates the intermediate signal current;
wherein the second stage comprises a transimpedance amplifier that is powered by the ground-referenced supply;
wherein the transimpedance amplifier includes an input that receives the intermediate signal current from the transconductance amplifier; and
providing an additional supply rail that enables the floating supply and/or reference to go below or above a supply voltage of the class-D amplifier.

* * * * *

UNITED STATES PATENT AND TRADEMARK OFFICE
CERTIFICATE OF CORRECTION

PATENT NO. : 11,296,666 B1
APPLICATION NO. : 16/796475
DATED : April 5, 2022
INVENTOR(S) : Larsen et al.

Page 1 of 1

It is certified that error appears in the above-identified patent and that said Letters Patent is hereby corrected as shown below:

In the Specification

In Column 4, Line 6, delete "LDO 32" and insert -- LDO regulator 32 --, therefor.

In Column 4, Line 45, delete "LDO 42" and insert -- LDO regulator 42 --, therefor.

Signed and Sealed this
Twenty-seventh Day of September, 2022

Katherine Kelly Vidal
*Director of the United States Patent and Trademark Office*